United States Patent
Camarota et al.

(10) Patent No.: US 8,712,718 B1
(45) Date of Patent: Apr. 29, 2014

(54) PREDICTING PERFORMANCE OF AN INTEGRATED CIRCUIT

(75) Inventors: Rafael C. Camarota, San Jose, CA (US); David L. Ferguson, Campbell, CA (US); Geoffrey Richmond, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 365 days.

(21) Appl. No.: 13/187,251

(22) Filed: Jul. 20, 2011

(51) Int. Cl.
*G01R 31/00* (2006.01)
*G01R 31/28* (2006.01)

(52) U.S. Cl.
CPC .................................. *G01R 31/2851* (2013.01)
USPC ........................................................ 702/117

(58) Field of Classification Search
CPC .................................................. G01R 31/2851
USPC ............................................................ 702/117
See application file for complete search history.

(56) References Cited

U.S. PATENT DOCUMENTS

| | | | | |
|---|---|---|---|---|
| 6,487,701 | B1 * | 11/2002 | Dean et al. | 716/136 |
| 6,586,921 | B1 * | 7/2003 | Sunter | 324/76.11 |
| 2008/0284465 | A1 * | 11/2008 | Kao | 326/30 |
| 2009/0048801 | A1 * | 2/2009 | Chandra | 702/120 |

* cited by examiner

*Primary Examiner* — Bryan Bui
(74) *Attorney, Agent, or Firm* — Kevin T. Cuenot (57) ABSTRACT

A method of characterizing a die can include correlating, using a processor, a static voltage profile of a die under test in wafer form with a plurality of test static voltage profiles. The plurality of test static voltage profiles can be associated with dynamic performance profiles. The method further can include predicting dynamic performance of the die under test according to the dynamic performance profile associated with a test static voltage profile that is correlated with the static voltage profile.

14 Claims, 6 Drawing Sheets

PREDICTING PERFORMANCE OF AN INTEGRATED CIRCUIT

FIELD OF THE INVENTION

One or more embodiments disclosed within this specification relate to predicting performance of an integrated circuit (IC). More particularly, one or more embodiments relate to predicting performance of an IC by using static voltage measurements to predict dynamic performance.

BACKGROUND

An integrated circuit (IC) is manufactured using a multiphase process involving photographic and chemical process steps. In general, common phases in fabricating an IC can include, but are not limited to, front-end-of-line (FEOL) processing, back-end-of-line (BEOL) processing, wafer testing, die preparation, and packaging. FEOL processing generally refers to the formation of circuit elements such as transistors. BEOL processing generally refers to the formation of metal layers and interconnects. Wafer testing or wafer sort generally refers to functional testing that can be performed on dies while still in wafer form. Die preparation generally refers to preparatory steps applied to dies for packaging. Finally, packaging generally refers to the process of mounting or placing dies within plastic, ceramic, or other packages that facilitates use of the IC within another system, e.g., upon a circuit board.

Typically, ICs are characterized in terms of performance. Performance often is measured in terms whether the IC is able to perform within established design requirements relating, for example, to operating frequency, signal fidelity, signal response, or the like. Each IC can be classified into one of a plurality of different "bins," where each bin refers to a particular range of performance typically within the design requirements. Each IC can be priced and sold according to the particular bin to which the IC is classified. Performance analysis also facilitates the identification of ICs that do not meet minimum design requirements.

In general, due to the high operating frequencies of many modern ICs, performance testing is not performed until the dies are no longer in wafer form and have been packaged. Though wafer testing does test various functional aspects of a die, wafer testing at frequencies higher than approximately 50 megahertz or so, e.g., into the gigahertz range, is not feasible. High speed testing during wafer testing, or sort, is infeasible in large part due to the probe card technology that is used and the physical form of the dies in wafer form. For example, the probe tips of the probe card contact probe pads on the bare wafer. The signal path between the probe tips and the measurement equipment is not a controlled impedance signal path. Further, there can be significant distance between the measurement equipment and the source of the signal being measured from the wafer. These factors, among others, e.g., parasitic capacitances and the like, can significantly inhibit testing at full operational speeds of the dies while in wafer form.

SUMMARY

One or more embodiments disclosed within this specification relate to predicting performance of an integrated circuit (IC) and, more particularly, to predicting performance of an IC by using static voltage measurements to predict dynamic performance.

An embodiment can include a method of characterizing a die. The method can include correlating, using a processor, a static voltage profile of a die under test in wafer form with a plurality of test static voltage profiles. The plurality of test static voltage profiles can be associated with dynamic performance profiles. The method can include predicting dynamic performance of the die under test according to the dynamic performance profile associated with a test static voltage profile that is correlated with the static voltage profile.

The plurality of test static voltage profiles can be determined from a plurality of dies tested in wafer form. The dynamic performance profiles can be determined for the plurality of dies after packaging.

The static voltage profile can specify at least one static voltage obtained from a node of a circuit of the die. The method can include first loading configuration data into the die while in wafer form to configure the circuit. In one aspect, the circuit can be selected to be an input/output circuit block of the die, wherein the predicted dynamic performance is termination impedance. In another aspect, the circuit can be selected to be a phase lock-loop. For example, the node of the circuit can be selected to be an internal bias point of the circuit.

The method also can include programming the predicted dynamic performance into a memory within the die while in wafer form. The die can be classified into one of a plurality of different performance groups according to the predicted dynamic performance of the die. In one aspect, the method can include classifying the die as defective responsive to determining that the static voltage profile is outside of an established range for the static voltage profile.

The method further can include generating the test static profiles by measuring static voltage of a node of a circuit from each of a plurality of dies still in wafer form and generating the dynamic performance profiles by measuring actual dynamic performance of each of the plurality of dies after each die is packaged. For each die, the test static voltage profile can be associated with the dynamic performance profile determined for the die.

Another embodiment can include a system for characterizing an IC. The system can include a memory storing program code and a processor coupled to the memory. Responsive to executing the program code, the processor can be configured to perform executable operations. The executable operations can include correlating a static voltage profile of a die under test in wafer form with a plurality of test static voltage profiles, wherein the plurality of test static voltage profiles are associated with dynamic performance profiles, and predicting dynamic performance of the die under test according to the dynamic performance profile associated with a test static voltage profile that is correlated with the static voltage profile.

The plurality of test static voltage profiles can be determined from a plurality of dies tested in wafer form. The dynamic performance profiles can be determined for the plurality of dies after packaging. The static voltage profile can specify at least one static voltage obtained from a node of a circuit of the die.

The processor further can be configured to perform an executable operation that includes programming the predicted dynamic performance into a memory within the die while in wafer form. In another aspect, the processor can be configured to perform an executable operation including classifying the die into one of a plurality of different performance groups according to the predicted dynamic performance of the die. The processor further can be configured to perform an executable operation including classifying the die as defective responsive to determining that the static voltage profile is outside of an established range for the static voltage profile.

Another embodiment can include an apparatus. The apparatus can include a die, wherein the die is in wafer form. The die can include an input port configured to receive configuration data for the die and a circuit placed in a known operating state responsive to loading the configuration data. The die also can include an analog-to-digital (A/D) converter coupled to a node of the circuit responsive to loading the configuration data. The A/D converter can be configured to sample a static voltage of the node. The die also can include an output port configured to output the sampled static voltage.

The die can include a memory coupled to the input port. The memory can be configured to store a measure of predicted dynamic performance of the die that is correlated with the sampled static voltage while the die is in wafer form.

The die also can include an analog multiplexer that includes an output coupled to the A/D converter. The die further can include a buffer having an input configured to receive a signal from the node of the circuit and an output coupled to an input of the analog multiplexer. The analog multiplexer can be configured to selectively pass the signal from the node of the circuit.

DETAILED DESCRIPTION

While the specification concludes with claims defining features of one or more embodiments that are regarded as novel, it is believed that the one or more embodiments will be better understood from a consideration of the description in conjunction with the drawings. As required, one or more detailed embodiments are disclosed within this specification. It should be appreciated, however, that the one or more embodiments are merely exemplary. Therefore, specific structural and functional details disclosed within this specification are not to be interpreted as limiting, but merely as a basis for the claims and as a representative basis for teaching one skilled in the art to variously employ the one or more embodiments in virtually any appropriately detailed structure. Further, the terms and phrases used herein are not intended to be limiting, but rather to provide an understandable description of the one or more embodiments disclosed herein.

One or more embodiments disclosed within this specification relate to predicting performance of an integrated circuit (IC) and, more particularly, to predicting performance of an IC by using static voltage measurements to predict dynamic performance. As used within this specification, the phrase "static voltage measurement(s)," and/or variants thereof, generally refer to "DC" performance of an IC as is understood by one skilled in the art of IC test development. The phrase "dynamic performance," and/or variants thereof, generally refer to "AC" performance of an IC as is understood by one skilled in the art of IC test development. During the IC manufacturing process, dies can be tested while still in wafer form, e.g., during wafer sort. One or more static, e.g., "DC," voltages can be measured from one or more selected nodes within the die. The static voltages that are measured for a given die can form a static voltage profile of the die.

The static voltage profile can be correlated with test data collected from prior tested dies to predict dynamic performance of the die. For example, high speed or high frequency performance of the die, e.g., dynamic or "AC" performance, can be predicted. In general, the dynamic performance of the die refers to the performance of circuitry within the die that operates at frequencies that are not feasibly tested while the die is still in wafer form, e.g., using probe card technology. The predicted dynamic performance is an indication of the likely performance to be expected for the various circuits of the die, or for the die itself, once packaged. Accordingly, the dynamic performance of an IC can be predicted by measuring static voltages of nodes of the die while still in wafer form, e.g., during wafer sort, without measuring high speed nodes, e.g., determining actual dynamic performance, of the circuits at full or high rates of speed.

Figure 1:
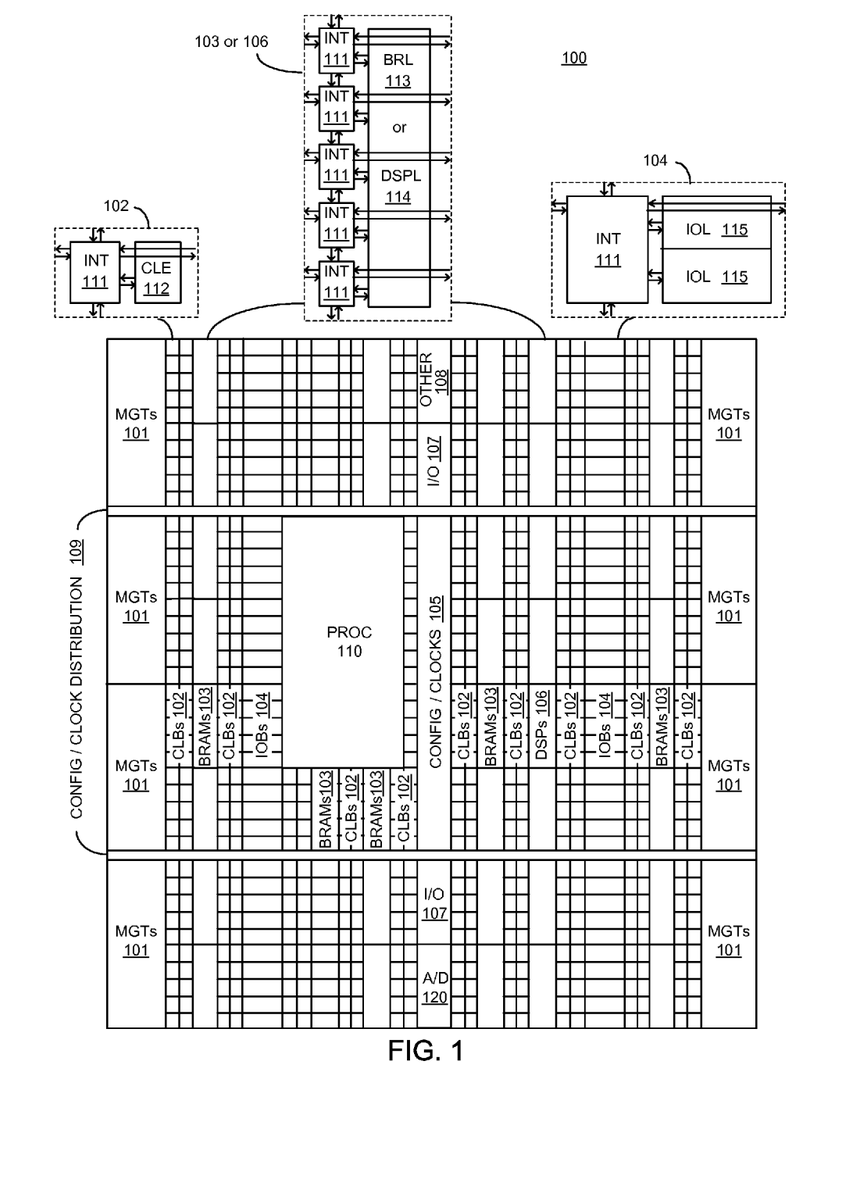
FIG. 1 is a first block diagram illustrating an architecture for an integrated circuit (IC) in accordance with an embodiment disclosed within this specification.

FIG. 1 is a first block diagram illustrating an architecture 100 for an IC in accordance with an embodiment disclosed within this specification. Architecture 100 can be implemented within a programmable IC. In one example, architecture 100 can be implemented within a field programmable gate array (FPGA) type of IC. As shown, architecture 100 includes several different types of programmable circuit, e.g., logic, blocks. For example, architecture 100 can include a large number of different programmable tiles including multi-gigabit transceivers (MGTs) 101, configurable logic blocks (CLBs) 102, random access memory blocks (BRAMs) 103, input/output blocks (IOBs) 104, configuration and clocking logic (CONFIG/CLOCKS) 105, digital signal processing blocks (DSPs) 106, specialized I/O blocks 107 (e.g., configuration ports and clock ports), and other programmable logic 108 such as digital clock managers, system monitoring logic, and so forth. Architecture 100 further can include one or more analog-to-digital (A/D) converters 120.

In some ICs, each programmable tile includes a programmable interconnect element (INT) 111 having standardized connections to and from a corresponding INT 111 in each adjacent tile. Therefore, the INTs 111, taken together, implement the programmable interconnect structure for the illustrated IC. Each INT 111 also includes the connections to and from the programmable logic element within the same tile, as shown by the examples included at the top of FIG. 1.

For example, a CLB 102 can include a configurable logic element (CLE) 112 that can be programmed to implement user logic plus a single INT 111. A BRAM 103 can include a BRAM logic element (BRL) 113 in addition to one or more INTs 111. Typically, the number of INTs 111 included in a tile depends on the height of the tile. In the pictured embodiment, a BRAM tile has the same height as five CLBs, but other numbers (e.g., four) can also be used. A DSP tile 106 can include a DSP logic element (DSPL) 114 in addition to an appropriate number of INTs 111. An IOB 104 can include, for example, two instances of an I/O logic element (IOL) 115 in addition to one instance of an INT 111. As will be clear to those of skill in the art, the actual I/O pads connected, for example, to IOL 115 typically are not confined to the area of IOL 115.

In the example pictured in FIG. 1, a columnar area near the center of the die (shown shaded in FIG. 1) is used for configuration, clock, and other control logic. Horizontal areas 109 extending from this column are used to distribute the clocks and configuration signals across the breadth of the programmable IC.

Some ICs utilizing the architecture illustrated in FIG. 1 include additional logic blocks that disrupt the regular columnar structure making up a large part of the IC. The additional logic blocks can be programmable blocks and/or dedicated circuitry. A processor block depicted as PROC 110 can be one example of dedicated circuitry that spans several columns of CLBs and BRAMs.

PROC 110 can be implemented as a hardwired processor that is fabricated as part of the die that implements the programmable circuitry of the IC. As a hardwired processor, e.g., a hard-core or dedicated circuitry, PROC 110 exists within the IC without first loading configuration data into the IC. PROC 110 can represent any of a variety of different processor types and/or systems ranging in complexity from an individual processor, e.g., a single core capable of executing program code, to an entire processor system having one or more cores, modules, co-processors, interfaces, or the like.

It should be appreciated that FIG. 1 is provided for purposes of illustration. In this regard, architecture 100 need not include PROC 110 or can include a processor in the form of a soft core. A soft core typically refers to a programmatic description of hardware that performs a particular function. A soft core, for example, can be specified as a hardware description language file or files, as configuration data such as a bitstream that programs a programmable IC, whether fully or partially programmable, as a netlist, or the like. Within a programmable IC, a soft-core type of processor, also referred to as a soft-processor, can be implemented using the programmable circuitry of the IC responsive to the loading of configuration data described.

As noted, architecture 100 can include A/D converters 120 that can be a hardwired circuit. A/D converters 120 can sample one or more voltages, e.g., analog or digital voltages, that are coupled to A/D converters 120 by loading appropriate configuration data to form conductive paths from the node to be sampled to A/D converters 120. In another aspect, hardwired paths can be implemented within architecture 100 that are able to propagate analog and/or digital voltages to A/D converters 120. Sample values generated by A/D converters 120 can be output via any of a variety of ports and/or I/O circuits of available in architecture 100.

A hardwired circuit such as PROC 110, A/D converters 120, or other circuits such as MGTs 101, for example, can include dedicated circuit blocks, interconnects, and inputs/outputs. A portion of the hardwired circuits, however, still can be set to operate in different modes or states responsive to register settings or other storage elements coupled to the hardwired circuits.

The phrase "programmable circuitry" can refer to programmable circuit elements within an IC, e.g., the various programmable or configurable circuit blocks or tiles described herein, as well as the interconnect circuitry that selectively couples the various circuit blocks, tiles, and/or elements according to configuration data that is loaded into the IC. For example, portions shown in FIG. 1 that are external to PROC 110 can be considered part of the, or the, programmable circuitry of the IC.

FIG. 1 is intended to illustrate an exemplary architecture that can be used to implement an IC that includes programmable circuitry, e.g., a programmable fabric, and a processor system. For example, the number of logic blocks in a column, the relative width of the columns, the number and order of columns, the types of logic blocks included in the columns, the relative sizes of the logic blocks, and the interconnect/logic implementations included at the top of FIG. 1 are purely exemplary. In an actual IC, for example, more than one adjacent column of CLBs is typically included wherever the CLBs appear, to facilitate the efficient implementation of a user circuit design. The number of adjacent CLB columns, however, can vary with the overall size of the IC. Further, the size and/or positioning of PROC 110 within the IC is for purposes of illustration only and is not intended as a limitation of the one or more embodiments disclosed within this specification.

While an FPGA is used as one example of a programmable IC, the phrase "programmable IC" can refer to a variety of other ICs. Another type of programmable IC is the complex programmable logic device, or CPLD. A CPLD includes two or more "function blocks" connected together and to I/O resources by an interconnect switch matrix. Other programmable ICs are programmed by applying a processing layer, such as a metal layer, that programmably interconnects the various elements on the device. These programmable ICs are known as mask programmable devices.

Programmable ICs can also be implemented in other ways, e.g., using fuse or antifuse technology. The phrase "programmable IC" can include, but is not limited to these devices, and further can encompass devices that are only partially programmable. For example, one type of programmable IC includes a combination of hard-coded transistor logic and a programmable switch fabric that programmably interconnects the hard-coded transistor logic. A programmable IC can include an application-specific integrated circuit (ASIC) that includes at least some programmable circuitry.

Figure 2:
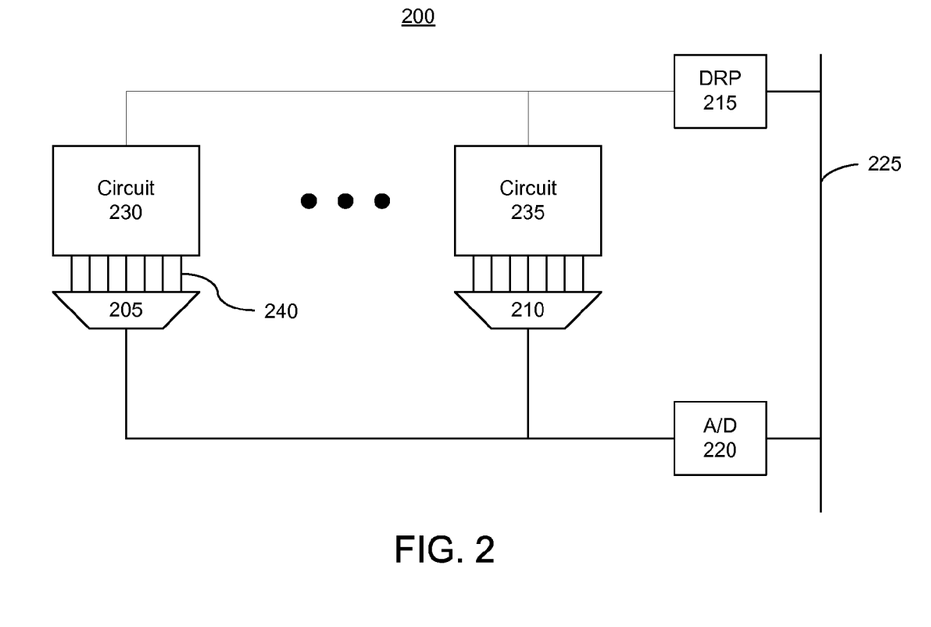
FIG. 2 is a second block diagram illustrating a system configured to measure static voltages from selected nodes of a die in accordance with another embodiment disclosed within this specification.

FIG. 2 is a second block diagram illustrating a system 200 configured to measure static voltages from selected nodes of a die in accordance with another embodiment disclosed within this specification. As shown, system 200 can include one or more analog multiplexers (multiplexers) 205 and 210, a dynamic reconfiguration port (DRP) 215, an A/D converter 220, and a Joint Test Action Group (JTAG) port 225. System 200 can be implemented within an IC in die form. In one example, the die can be a programmable IC. In another example, the die is not a programmable IC.

In general, each die within a wafer that is to be tested by a wafer testing system can be configured to include one or more probe pads. Accordingly, JTAG port 225 can be configured to include probe pads that facilitate contact by a probe card communicatively linking JTAG port 225 with a wafer testing system. As shown, A/D converter 220 can be communicatively linked to JTAG port 225. A/D converter 220 can include one or more independent channels of A/D converters allowing A/D converter 220 to receive one or more independent static voltages concurrently to be sampled with a specified precision. For example, A/D converter 220 can be configured to generate 12-bit precision samples, but is not limited in the precision of sample generated.

Multiplexers 205 and 210 each can be configured to receive one or more signals from circuits 230 and 235 respectively. More particularly, any nodes of circuits 230 and 235 that are to be sampled can be coupled to multiplexers 205 and 210 respectively. As noted, multiplexers 205 and 210 can be implemented as analog multiplexers capable of selectively passing analog voltages coupled to the input(s) of each respective one of multiplexers 205 and 210. Similarly, outputs from each of multiplexers 205 and 210 can be coupled to A/D converter 220 via analog circuitry configured to propagate analog voltages. Accordingly, the particular nodes coupled to multiplexer 205 and/or multiplexer 210 can be analog nodes, digital nodes, or a combination thereof.

In an embodiment, both digital nodes and analog nodes from circuit 230 and/or circuit 235 can be coupled to A/D converter 220 by selectively passing signals from the nodes via multiplexers 205 and/or 210. In another embodiment, one or more digital nodes can be read directly by DRP 215 rather than being sampled by A/D converter 220. In either case, the resulting sampled static voltages can be output from JTAG port 225. One or more static voltages measured from a die, whether digital, analog, or a combination of both, can be referred to as a static voltage profile.

For example, circuit 230 can be a phase lock-loop (PLL) voltage controlled oscillator (VCO) that utilizes an auto-calibration mechanism that allows circuit 230 to operate over a wide range of supply voltages, temperatures, and process variation. The auto-calibration mechanism can utilize one or more analog voltages controlled by feedback loops etc. Each of the particular nodes of circuit 230 that is to be measured, e.g., nodes of the auto-calibration mechanism, can be coupled to multiplexer 205. The nodes can be coupled to multiplexer 205 via signals such as signal 240 or other suitable interconnect circuitry capable of propagating an analog signal, a digital signal, or the like as appropriate. Similarly, circuit 235 can include one or more nodes that can be coupled to multiplexer 210 as described.

Other examples of circuits that can include nodes that can be sampled can include, but are not limited to, high speed transceivers such as MGTs 101 of FIG. 1, an output of a digital-to-analog converter configured to control an active termination circuit, e.g., an I/O circuit block, low pass filters, high pass filters, or other circuits that include bias nodes intended to have a particular analog bias voltage and/or digital voltage based upon the intended operating state of the circuit.

Configuration data from the wafer testing system can be loaded into the die under test while in wafer form via JTAG port 225 and provided to DRP 215. Via DRP 215, the configuration data can be loaded into configuration memory of the die to implement circuitry therein. For example, in the case of a programmable IC (die), configuration data can implement entire circuit designs, parameterize hardwired circuits, e.g., circuit 230 and/or circuit 235, or the like. In the case of a die that is not programmable, the configuration data can include one or more parameters necessary to parameterize hardwired circuitry. In one aspect, the configuration data can specify which signals of nodes of circuit 230 and/or circuit 235 that multiplexer 205 and/or 210 respectively, are to pass at any given time to ensure that no conflict exists upon the circuitry coupling the output of each of multiplexers 205 and 210 to A/D converter 220. For example, the configuration data can specify behavior of control signals provided to multiplexers 205 and/or 210 to select particular signals to pass.

In illustration, consider the case in which a signal generator is applied to a die in wafer form to deliver an input frequency that is compatible with the wafer testing system. Through DRP port 215, by way of JTAG port 225, the wafer testing system can program one or more control bits of circuit 230, which can be a PLL for purposes of illustration. Via DRP 215, circuit 230 can be provided with an input to output frequency problem to solve. A lock output of circuit 230, which can be one of the nodes that is passed through multiplexer 205 to A/D converter 220, can be sampled so that the wafer testing system can determine when circuit 230 and auto-calibration has stabilized. Responsive to detecting stabilization via an output from JTAG port 225, measurement of static voltages of one or more other nodes of circuit 230 can be performed.

A/D converter 220 can sample static voltages of selected nodes to determine the values of nodes of circuit 230 at typical voltages and temperatures. A/D converter 220 can sample multiple static voltages from circuit 230 in various operating modes. The resulting static voltages can be stored in the form of one or more static voltage profiles for subsequent use. Depending upon the particular type of circuit 230, various frequency and phase synthesis problems can be devised through the continued or repetitive loading of configuration data specifying circuit designs that exercise desired measurable nodes.

By conducting measurements as described for multiple dies, expected static voltage measurements can be determined. Thus, when the set of static voltage measurements of [5, 5, 5, 5, 5] for the nodes of circuit 230 are expected, or normal, the set of static voltage measurements of [3, 1, 4, 9, 11] can be considered abnormal or outside of the range defined as normal. A die in which circuit 230 yields abnormal values can be identified as a die that will not likely be able to scale or operate throughout the entire operating range specified within the design requirements.

For example, consider the case of a node that can have possible voltages anywhere between 0.3 volts and 0.7 volts. The output of the circuit, however, can sweep over a large frequency range or possibly provide a wide range of impedances. When set to generate an output that is midway in the range of the circuit, and the node of interest is determined to have a voltage of 0.6 volts, it can be determined that the circuit has little headroom to achieve the upper end of the intended voltage and temperature design range for the output of the circuit. More particularly, the bias node is already near the upper limit, whereas the output of the circuit is not. Thus, to continue the example, when the circuit is generating an output in the middle of the defined output range, the node, or nodes, of interest can be expected to have a voltage near the middle of the allowable range for that node or nodes as the case may be.

In further illustration, when testing a PLL within a die still in wafer form, the wafer testing system can provide an input frequency to the PLL that is approximately 50 MHz. The PLL can be configured to multiply the input frequency by 20 to generate a 1 GHz operating frequency. The PLL also can be programmed to divide by 20 when generating the resulting output signal that a probe card can accurately read and/or measure. Thus, the input and output frequencies of the PLL are within the frequency range of a probe card and are the same at 50 MHz. The internal frequency generated by the PLL is higher than is accurately measured by the probe card. Still, the internal frequency can be evaluated by measuring the static voltages of one or more internal nodes of the PLL to serve as a proxy or indicator that the 1 GHz frequency is achieved within the PLL given the verified input and output signals described. In effect, determining the static voltages of the internal nodes of the PLL indicate how efficiently the circuit, in this case a PLL, is working to generate the requested frequency.

The aforementioned examples largely relate to operating frequencies of a circuit of interest. In another example, an active termination circuit can be measured in a similar manner. One or more static voltages of the active termination circuit can be measured to obtain a collection of static voltages for active termination circuits. By evaluating multiple active termination circuits, a determination can be made as to whether a given active termination circuit is normal and, therefore, likely able to scale through the range of impedances that the circuitry is intended to provide per the design requirements. Similarly, the static voltages sampled from an adjustable filter, e.g., a high pass filter or a low pass filter, can indicate whether the filter is functioning normally or abnormally and, thus, whether the filter is likely able to operate throughout the intended operating range.

In an embodiment, the particular nodes that are selected for static measurement can be those determined to be highly correlated with dynamic performance of the die or circuits of interest within the die. In an example, dies predicted to have similar predicted dynamic performance can be tagged or binned together. Dies that are binned together can be sold according to the particular binning that is determined or used with other dies of the same bin within multi-die ICs.

Figure 3:
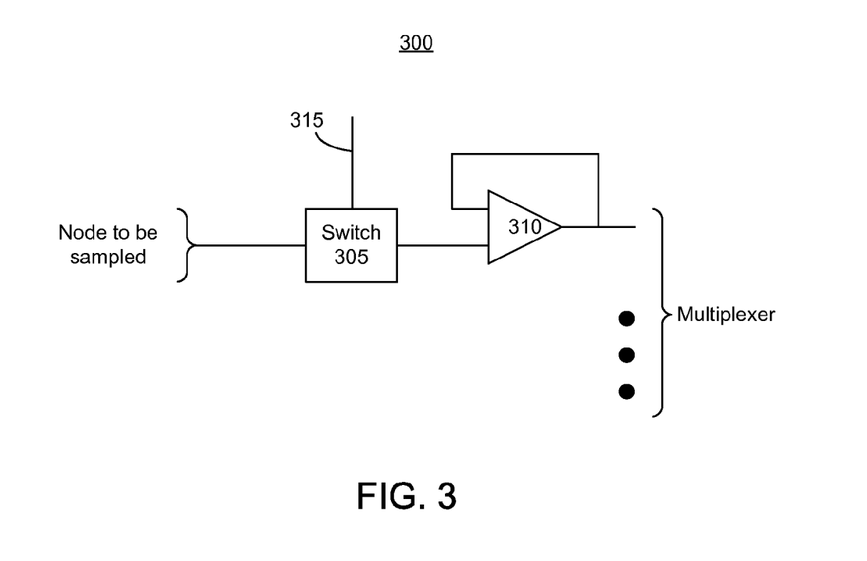
FIG. 3 is a third block diagram illustrating a buffer system in accordance with another embodiment disclosed within this specification.

FIG. 3 is a third block diagram illustrating a buffer system 300 in accordance with another embodiment disclosed within this specification. FIG. 3 illustrates a more detailed view of the circuitry coupling a selected node to be sampled and the multiplexer that selectively passes signals to the A/D converter illustrated in FIG. 2. For example, buffer system 300 can be one embodiment for implementing signal 240 of FIG. 2.

Analog multiplexers, as described with reference to FIG. 2, can induce high capacitance on nodes of high frequency circuits such as a PLL capable of generating frequencies in the gigahertz range. Analog multiplexers can also induce coupling between nodes that can cause unacceptable noise and jitter in the PLL circuit. Buffer system 300 can reduce and/or eliminate such effects.

Buffer system 300 can include a switch 305 coupled to a buffer 310. As shown, a node to be sampled from a selected circuit, e.g., circuit 230 and/or circuit 235 of FIG. 2, can be coupled to an input of switch 305. Switch 305 also can include an enable port coupled to an enable signal 315. Accordingly, switch 305 can be configured to only pass the signal from the node to be sampled responsive to enable signal 315. When enable signal 315 is low, for example, the node to be sampled can be electrically isolated from buffer 310. When enable signal 315 is high, the signal of the node to be sampled can be passed through to an input of buffer 310. During normal operation of a circuit, e.g., after testing and when used in the field, or when a node is not being sampled during testing, switch 305 can increase isolation of the node from the static measurement circuitry described within this specification. Switch 305 can be implemented using any of a variety of different circuits ranging in complexity from individual transistors to more complex arrangements formed of multiple circuit elements. In an embodiment, the state of enable signal 315 can be controlled by the loading of configuration data or signals into the die from, for example, the a wafer testing system so that particular ones of switches 305 can be enabled at any given time.

An output of switch 305 can be coupled to the input of buffer 310. Switch 305 can be configurable to isolate the node to be sampled from the input load of buffer 310. Buffer 310 can be configured as a unity gain buffer having a feedback path in which the output from buffer 310 is fed back into another input of buffer 310. The output of buffer 310 also can be coupled to an input of a multiplexer such as multiplexer 205 and/or 210 of FIG. 2. Buffer 310 can isolate the capacitance of the analog multiplexer and node of the circuit for which a static voltage measurement is to be sampled. Buffer 310 further can reduce dynamic coupling to other nodes to be sampled. The addition of unity gain buffers can be added to circuitry during the design and validation of the die without requiring simulation of the analog multiplexer structure.

Figure 4:
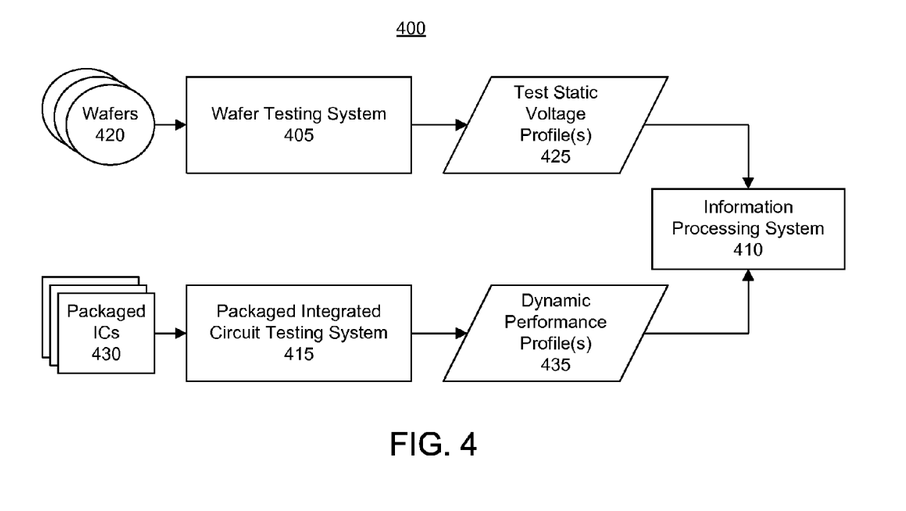
FIG. 4 is a fourth block diagram illustrating a system for generating test data in accordance with another embodiment disclosed within this specification.

FIG. 4 is a fourth block diagram illustrating a system 400 for generating test data in accordance with another embodiment disclosed within this specification. More particularly, system 400 can generate performance prediction data. As shown, system 400 can include a wafer testing system 405 that can be coupled to a data processing system 410. System 400 further can include a packaged IC testing system (IC testing system) 415 that can be coupled to data processing system 410.

As shown, wafer testing system 405 can be configured to receive and test a plurality of wafers 420. Each of wafers 420 can include one or more dies. In general, wafer testing system 405 can utilize probe card technology to probe the various dies of the wafers 420 that are to be tested. As known, through a probe card, a die can be provided with supply voltages, grounds, one or more test signals, configuration data and/or parameters, and the like. The die generally is configured to include probe pads that couple to internal circuitry of the dies. The probe card can contact the probe pads to provide the aforementioned signals and further to read-back signals from the dies.

Wafer testing system 405 can generate test static voltage profiles 425 from testing wafers 420 and store test static voltage profiles 425 within data processing system 410, e.g., within a computer readable storage medium within data processing system 410. Each test static voltage profile 425 can include, or specify, at least one static voltage measurement for a selected node within a die of a tested wafer. In one aspect, each test static voltage profile can specify static voltages for nodes of a particular circuit with the die having a particular configuration or setting. In this regard, multiple static voltage profiles can be generated for each die.

IC testing system 415 can be configured to receive and test a plurality of packaged ICs 430. Each of packaged ICs 430 can be tested for dynamic performance by IC testing system 415. In general, IC testing system 415 can subject each packaged IC to high speed, or full speed, testing, e.g., in the gigahertz range, in order to test circuits such as transceivers, PLLs, termination circuitry, filters, or the like.

IC testing system 415 can generate dynamic performance profiles 435 that can be provided to, and stored within, data processing system 410. Dynamic performance profiles 435 can be specified for each packaged IC that is tested. Dynamic performance profiles 435 for a given packaged IC, for example, can specify one or more measures of performance for the packaged IC. For example, a dynamic performance profile can specify the range of achievable frequencies of operation for one or more circuits therein, a rating for the IC as a whole, e.g., a bin or classification, ratings for individual circuits within the packaged IC, or the like. Data processing system 410 can correlate test static voltage profiles 425 with dynamic performance data 435 to generate performance prediction data. More particularly, for each die that is tested in wafer form, the test static voltage profile determined or samples for that die can be associated with the dynamic performance profiles determined for the packaged IC that includes the same die to form the performance prediction data.

Figure 5:
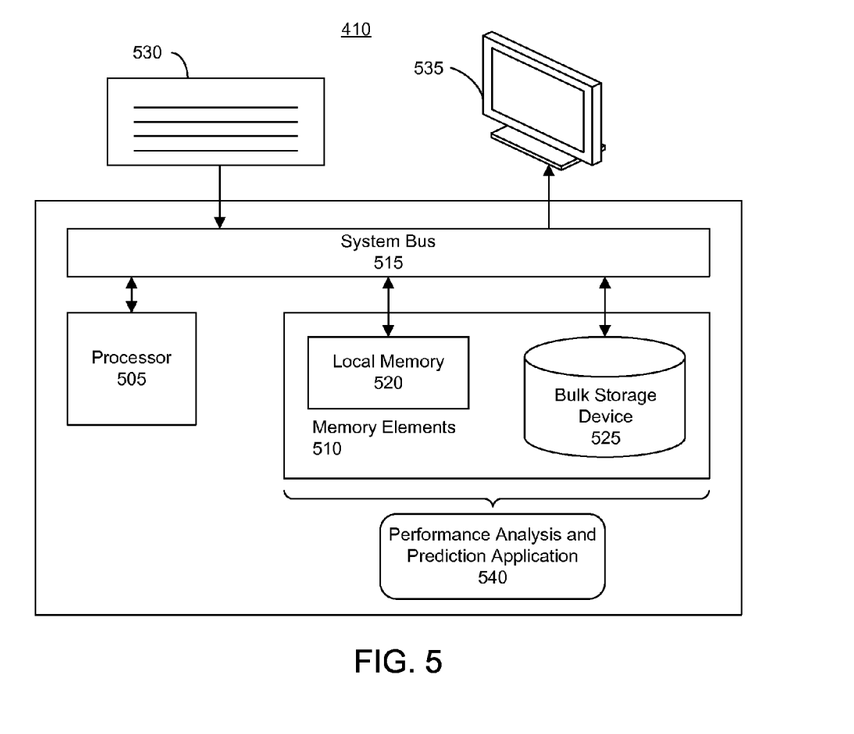
FIG. 5 is a fifth block diagram illustrating an example of a data processing system as illustrated in FIG. 4.

FIG. 5 is a fifth block diagram illustrating an example of data processing system 410 of FIG. 4. Data processing system 410 can perform various functions relating to the storage and/or processing of test data, e.g., performance prediction data, as described within this specification.

Data processing system 410 can include at least one processor 505 coupled to memory elements 510 through a system bus 515. As such, data processing system 410 can store program code within memory elements 510. Processor 505 can execute the program code accessed from memory elements 510 via system bus 515. In one aspect, for example, data processing system 410 can be implemented as a computer that is suitable for storing and/or executing program code. It should be appreciated, however, that data processing system 410 can be implemented in the form of any system including a processor and memory that is capable of performing the functions described within this specification.

Memory elements 510 can include one or more physical memory devices such as, for example, local memory 520 and one or more bulk storage devices 525. Local memory 520 refers to random access memory or other non-persistent memory device(s) generally used during actual execution of the program code. Bulk storage device(s) 525 can be implemented as a hard drive or other persistent data storage device. Data processing system 410 also can include one or more cache memories (not shown) that provide temporary storage of at least some program code in order to reduce the number of times program code must be retrieved from bulk storage device 525 during execution.

Input/output (I/O) devices such as a keyboard 530, a display 535, and a pointing device (not shown) optionally can be coupled to data processing system 410. The I/O devices can be coupled to data processing system 410 either directly or through intervening I/O controllers. Network adapters also can be coupled to data processing system 410 to enable data processing system 410 to become coupled to other systems, computer systems, remote printers, and/or remote storage devices through intervening private or public networks. Modems, cable modems, and Ethernet cards are examples of different types of network adapters that can be used with data processing system 410.

As pictured in FIG. 5, memory elements 510 can store a performance analysis and prediction application (application) 540. Application 540, being implemented in the form of executable program code, can be executed by data processing system 410 to perform executable operations relating to the storage and/or processing of test data described within this specification.

Figure 6:
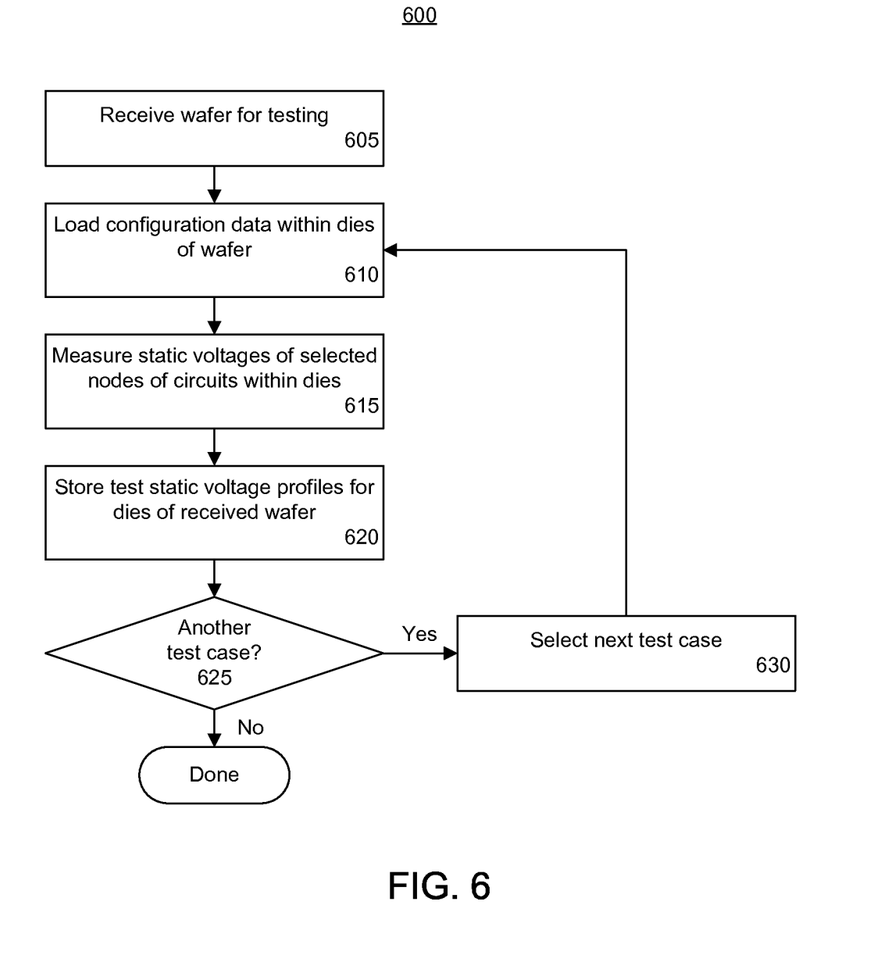
FIG. 6 is a first flow chart illustrating a method of generating static voltage profiles in accordance with another embodiment disclosed within this specification.

FIG. 6 is a first flow chart illustrating a method 600 of generating static voltage profiles in accordance with another embodiment disclosed within this specification. Method 600 can be implemented using a system as described with reference to FIG. 4 of this specification, e.g., using a wafer testing system, in which dies include systems and/or circuitry as described with reference to FIGS. 1-3 of this specification.

In step 605, the wafer testing system can receive a wafer for testing. As discussed, the wafer can include one or more dies that subsequently will be separated and packaged into separate ICs. In an embodiment, each of the dies can be a programmable IC within which different circuit designs can be implemented through the loading of different configuration data. In another embodiment, each of the dies can be an IC that is not programmable, but that includes circuitry that can be parameterized, e.g., loaded with data that places the die in an operating state selected from multiple potential operating states.

In step 610, the wafer testing system can load configuration data within the dies of the wafer. For example, the wafer testing system can load a circuit design within the dies of the wafer, load one or more parameters necessary to parameterize a particular circuit, or the like. It should be appreciated that during step 610, the particular nodes to be measured can be selected and coupled to the measurement circuitry as described. Further, the circuitry including the nodes to be measured can be configured and allowed to stabilize as described.

In step 615, the wafer testing system can measure one or more static voltages of selected nodes of circuits within the dies as test data. As noted, the static test data can include analog voltages measured from analog nodes and/or digital voltages measured from digital nodes. In measuring the static voltages, wafer testing system also can supply one or more test signals to each die as well as record one or more output signals from each die. As discussed, measurement of one or more nodes can be performed responsive to an indication from circuitry within the die that the circuitry and/or node(s) have stabilized.

In step 620, the test static voltage profile for each die can be stored, for example, within a computer readable storage medium. The test static voltage profiles for each wafer can be stored on a per-die basis so that the static voltage measurements are correlated with the particular die from which the measurements were taken.

In step 625, the wafer testing system can determine whether additional test cases remain. For example, the wafer testing system can test the dies of the wafer using different test cases wherein each test case is intended to test one or more selected nodes for a particular circuit configuration, for a selected power or voltage, a selected temperature, and a selected operating range.

Test cases can be designed to specify a different or varied configuration data, e.g., circuit designs, that exercise the nodes of interest, e.g., the nodes for which static voltages are to be determined. In this example, the term "exercise" can refer to setting operating conditions based on operating frequency, temperature, and voltage that will require the node in normal operation to be in the 25%±N %, 50%±N %, and the 75%±N % voltage ranges allowed or specified for that particular node, where "N" can be 10. It should be appreciated, however, that the particular percentages and ranges used are for purposes of illustration only and are not intended to be limiting.

Each test case can specify a different parameterization, a different circuit design, different power, temperature, or the like to ensure that each node for which a static voltage measurement is desired is obtained, e.g., sampled, over varying conditions. Each test case can vary in only one of the foregoing conditions, e.g., only in temperature or only in parameterization of the circuit to test a different operating range using same temperature, or in more than one of the foregoing conditions.

When at least one addition test case remains, method 600 can continue to step 630, where a next test case is selected. After step 630, method 600 can loop back to step 610 to continue the process using the next selected test case. When the wafer testing system determines that no further test cases remain, method 600 can end.

Method 600 can be repeated for multiple wafers that are collected from multiple process corners. The wafers further can be tested with the circuit designs over a wide range of temperatures and voltages. In one aspect, the number of temperature and voltage points tested can exceed the number of points typically used during production wafer sorting while including, at a minimum, intended production wafer sort temperature and voltage operating point(s).

Figure 7:
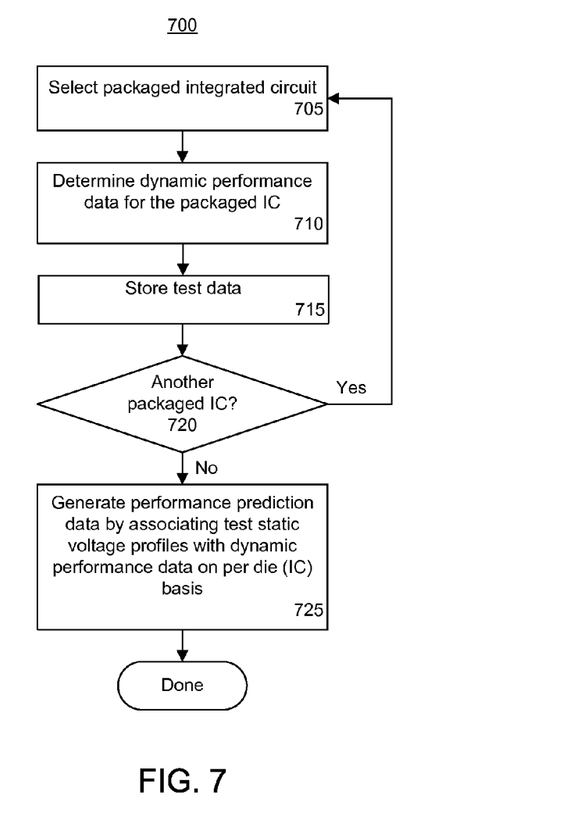
FIG. 7 is a second flow chart illustrating a method of collecting dynamic performance profiles for ICs in accordance with another embodiment disclosed within this specification.

FIG. 7 is a second flow chart illustrating a method 700 of collecting dynamic performance profiles for ICs in accordance with another embodiment disclosed within this specification. Method 700 can be implemented using an IC testing system as described with reference to FIG. 4. Method 700 can begin in a state where the dies tested as described in FIG. 6 are tagged and subsequently packaged into ICs for tracking purposes.

Method 700 can begin in step 705 where a packaged IC can be selected by the IC testing system. In step 710, the IC testing system can determine dynamic performance profiles for the packaged IC. For example, the packaged IC can be loaded with one or more different test circuit designs. Signals of the packaged IC, e.g., dynamic signals, can be measured. For example, the maximum frequency of various signals of interest can be measured over various temperature, voltage, configurations, and/or operating states.

In step 715, the dynamic performance profiles can be stored within a computer readable storage medium. The dynamic performance profiles that are generated and stored can be correlated with the particular IC from which the dynamic performance profiles were obtained. In one aspect, the dynamic performance profiles can be compared with predefined bins or evaluated based upon a continuous analog spectrum of dynamic performance data.

In step 720, a determination can be made as to whether additional packaged ICs remain to be tested. When one or more additional packaged ICs remain to be tested, method 700 can loop back to step 705 to select a next packaged IC to be tested and continue processing. When no further packaged ICs remain to be tested, method 700 can continue to step 725.

In step 725, the IC testing system, or another data processing system as described within this specification, can correlate the test static voltage profiles with the dynamic performance profiles on a per die basis to generate performance prediction data. More particularly, for each die, the test static voltage profile, or profiles, determined for the die can be paired or correlated with the dynamic performance profiles for that die or, more particularly, with the packaged IC that includes that die. In step 725, for example, the data processing system can generate performance prediction data. In one aspect, the performance prediction data can be specified in the form of a look-up table. The look-up table can be used during production wafer sorting. The look-up table can effectively assign the dynamic performance profile(s) for a given packaged IC to the static voltage profile(s) determined for the dies within the packaged IC. In an embodiment, a dynamic performance profile can be generated for an IC for each of the particular configurations for which the die of the IC was tested for purposes of generating a test static voltage profile. Accordingly, the dynamic performance profile for a given IC and a given configuration can be matched or associated with the test static voltage profile of the same die having the same configuration.

Figure 8:
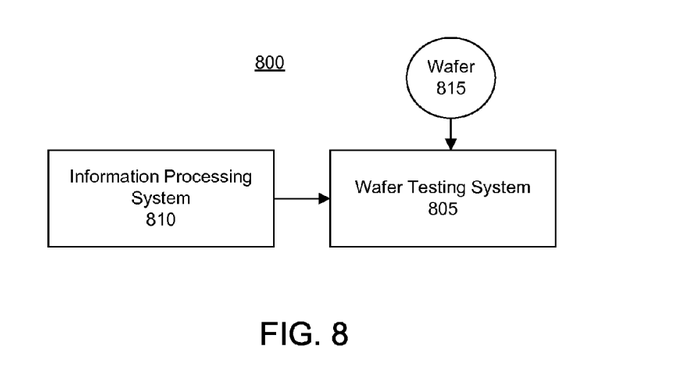
FIG. 8 is a sixth block diagram illustrating a system configured to predict performance of dies in accordance with another embodiment disclosed within this specification.

FIG. 8 is a sixth block diagram illustrating a system 800 configured to predict performance of dies in accordance with another embodiment disclosed within this specification. As shown, system 800 can include a wafer testing system 805 and optionally a data processing system 810. Wafer testing system 805 can be implemented substantially as described with reference to FIG. 4. Data processing system can be implemented substantially as described with reference to FIG. 5.

In one aspect, wafer processing system 805 can be used to interface with dies that are tested in wafer form, while data processing system 810 can be configured to perform processing and/or comparison of static voltage profiles obtained from the dies under test with the performance prediction data that has been collected as described. It should be appreciated that in some cases, the functions performed by data processing system 810 can be incorporated into wafer processing system 805.

In general, system 800 can be configured to predict dynamic performance of dies according to static voltage measurements while the dies are still in wafer form, e.g., during wafer sort. Wafer testing system 805 can receive a wafer 815 for testing. As discussed, wafer 815 can include one or more dies. Wafer testing system can be configured to subject wafer 815 to one or more test cases to obtain one or more static voltage profiles from the dies of wafer 815.

The resulting static voltage profiles can be used to locate a measure of predicted dynamic performance from the performance prediction data. As noted, the performance prediction data can include test static voltage profiles associated with dynamic performance profiles. In one embodiment, multiple static voltage profiles can be taken for each die. For example, each static voltage profile can include voltages of one or more nodes for a particular test case for a circuit or circuits to be tested. In any case, the static voltage profile(s) obtained from dies of wafer 815 can be matched, or correlated with, test static voltage profiles of the performance prediction data. The dynamic performance profile(s) associated with the matched or correlated test static voltage profile can be used as the predicted dynamic performance for the die currently being tested in wafer form.

Figure 9:
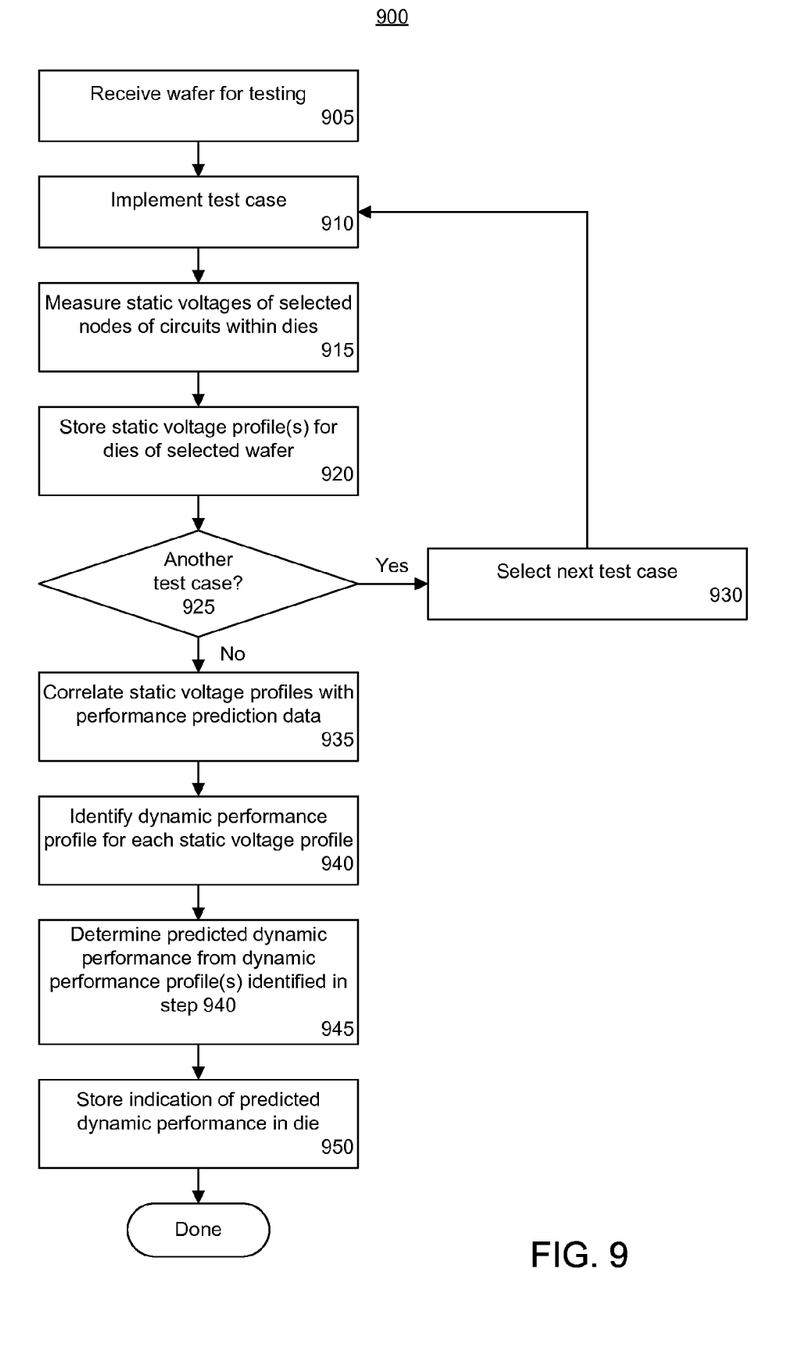
FIG. 9 is a third flow chart illustrating a method of predicting performance for a die in accordance with another embodiment disclosed within this specification.

FIG. 9 is a third flow chart illustrating a method of 900 of predicting performance for a die in accordance with another embodiment disclosed within this specification. Method 900 can be implemented by a system as described with reference to FIG. 8. It should be appreciated that method 900 can be repeated as may be required to estimate performance, e.g., dynamic performance, of more than one wafer or die during the manufacturing process.

In step 905, the system can receive a wafer for processing. In step 910, the system can execute a test case for the dies of the received wafer. In step 915, the system can measure one or more static voltages of selected nodes of circuits within the dies. In step 920, the static voltage profile that includes the various static voltages measured can be stored within a computer readable storage medium. As noted, the static voltage profiles can be stored on a per die basis.

In step 925, the system can determine whether there are any further test cases for which the wafer is to be tested. When one or more test cases remain, method 900 can continue to step 930 to select and implement the next test case. When no further test cases remain, method 900 can proceed to step 935.

In step 935, the system can correlate, e.g., compare, the static voltage profiles of each die with the performance prediction data stored from prior testing of dies and packaged ICs. More particularly, the static voltage profiles can be compared or correlated with the test static voltage profiles specified within the performance prediction data for prior dies tested while in wafer form. In one aspect, the performance prediction data can include one or more test static voltage profiles that are correlated with a minimum measure of acceptable dynamic performance, e.g., minimum dynamic performance profile(s).

In step 940, the system can determine a dynamic performance profile, or profiles, for each static voltage profile. For example, for each die of the wafer, and for each static voltage profile of a die, the system can determine whether the static voltage profile matches a test static voltage profile of the performance prediction data. In this manner, the system can "index" into a multi-dimensional look-up table of the performance prediction data and locate a corresponding test static voltage profile. The dynamic performance profile that is associated with the located, e.g., matched, test static voltage profile, can be used or assigned to the die. Thus, when multiple static voltage profiles are determined for a die, the die can be associated with each of the multiple, dynamic performance profiles found within the performance prediction data. For example, the die is associated with one measure of dynamic performance for each static voltage profile of the die.

In step 945, for each die of the wafer, a predicted dynamic performance can be determined based upon each of the plurality of dynamic performance profiles associated with the die. In one example, the different dynamic performance profiles can be averaged together or combined using another function or weighting to determine predicted dynamic performance, or a measure thereof. In another example, a worst of the predicted dynamic performance profiles of the die can be used as the predicted dynamic performance, or measure thereof, of the die. In any case, the die can be classified into one of multiple possible performance groups, e.g., bins, according to the predicted dynamic performance of the die.

It should be appreciated that in some cases, the predicted dynamic performance of the die can indicate that the die does not meet the minimum performance requirements established for a die, e.g., for the lowest performance bin of dies. For instance, one or more values of the static voltage profile of a die can be outside of an established range for the values. In that case, the die can be identified as defective or as not meeting the minimum requirements for dynamic performance of a die.

In step 950, for each die of the wafer, the system can store the predicted dynamic performance as determined in step 945 within the die. For example, the system, via the wafer testing system, can write a value that indicates the predicted dynamic performance of the die within a non-volatile memory of the die. During subsequent phases of the IC manufacturing process, the indicator can be read and used for sorting dies into like classifications. In one aspect, the measure of predicted dynamic performance can be a bin assignment.

The one or more embodiments disclosed within this specification utilize measures of static voltage within a die to classify or otherwise group dies during wafer sort without the expense of testing dies at full operational speed. Further, analog nodes and high speed mixed signal nodes that are not otherwise easily tested can be tested more readily. Defective dies also can be more readily identified during wafer sort. Without performing analysis of nodes using static voltages as described within this specification, expensive at-speed tests vectors would be required to infer the operation of the nodes.

Within this specification, the same reference characters are used to refer to terminals, signal lines, wires, and their corresponding signals. In this regard, the terms "signal," "wire," "connection," "terminal," and "pin" may be used interchangeably, from time-to-time, within the this specification. It also should be appreciated that the terms "signal," "wire," or the like can represent one or more signals, e.g., the conveyance of a single bit through a single wire or the conveyance of multiple parallel bits through multiple parallel wires. Further, each wire or signal may represent bi-directional communication between two, or more, components connected by a signal or wire as the case may be.

The flowcharts in the figures illustrate the architecture, functionality, and operation of possible implementations of systems, methods and computer program products according to one or more embodiments disclosed within this specification. In this regard, each block in the flowcharts can represent a module, segment, or portion of code, which includes one or more portions of executable program code that implements the specified logical function(s).

It should be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It also should be noted that each block of the flowchart illustrations, and combinations of blocks in the flowchart illustrations, can be implemented by special purpose hardware-based systems that perform the specified functions or acts, or combinations of special purpose hardware and executable instructions.

One or more embodiments can be realized in hardware or a combination of hardware and software. One or more embodiments can be realized in a centralized fashion in one system or in a distributed fashion where different elements are spread across several interconnected systems. Any kind of data processing system or other apparatus adapted for carrying out at least a portion of the methods described herein is suited.

One or more embodiments further can be embedded in a device such as a computer program product, which comprises all the features enabling the implementation of the methods described herein. The device can include a data storage medium, e.g., a non-transitory computer-usable or computer-readable medium, storing program code that, when loaded and executed in a system comprising memory and a processor, causes the system to perform at least a portion of the functions described within this specification. Examples of data storage media can include, but are not limited to, optical media, magnetic media, magneto-optical media, computer memory such as random access memory, a bulk storage device, e.g., hard disk, or the like.

The terms "computer program," "software," "application," "computer-usable program code," "program code," "executable code," variants and/or combinations thereof, in the present context, mean any expression, in any language, code or notation, of a set of instructions intended to cause a system having an information processing capability to perform a particular function either directly or after either or both of the following: a) conversion to another language, code, or notation; b) reproduction in a different material form. For example, program code can include, but is not limited to, a subroutine, a function, a procedure, an object method, an object implementation, an executable application, an applet, a servlet, a source code, an object code, a shared library/dynamic load library and/or other sequence of instructions designed for execution on a computer system.

The terms "a" and "an," as used herein, are defined as one or more than one. The term "plurality," as used herein, is defined as two or more than two. The term "another," as used herein, is defined as at least a second or more. The terms "including" and/or "having," as used herein, are defined as comprising, i.e., open language. The term "coupled," as used herein, is defined as connected, whether directly without any intervening elements or indirectly with one or more intervening elements, unless otherwise indicated. Two elements also can be coupled mechanically, electrically, or communicatively linked through a communication channel, pathway, network, or system.

One or more embodiments disclosed within this specification can be embodied in other forms without departing from the spirit or essential attributes thereof. Accordingly, reference should be made to the following claims, rather than to the foregoing specification, as indicating the scope of the one or more embodiments.

What is claimed is:

1. A method comprising:
storing a test static voltage profile for each of a plurality of dies tested in wafer form, wherein each test static voltage profile specifies a static voltage measured at a node of a circuit within the die;
storing a dynamic performance profile for each of the plurality of dies determined after packaging of the die, wherein each test static voltage profile is associated with the dynamic performance profile for the same die of the plurality of dies;
determining a static voltage profile of a die under test in wafer form by measuring a static voltage of a node of a circuit of the die under test;
matching, using a processor, the static voltage profile of the die under test in wafer form with a test static voltage profile of the plurality of test static voltage profiles;
assigning the dynamic performance profile associated with the matched test static voltage profile to the die under test; and
classifying the die under test into one of a plurality of different performance groups according to the assigned dynamic performance profile.

2. The method of claim 1, wherein:
the matching comprises matching each of a plurality of different static voltage profiles of the die under test with different ones of the plurality of test static voltage profiles; and
the assigning comprises assigning each dynamic performance profile associated with a matched test static voltage profile to the die under test.

3. The method of claim 2, wherein each different static voltage profile of the die under test is generated using a different configuration for the die.

4. The method of claim 1, further comprising:
first loading configuration data into the die under test while in wafer form to configure the circuit of the die under test.

5. The method of claim 4, further comprising:
selecting the circuit of the die under test to be an input/output circuit block, wherein the predicted dynamic performance is termination impedance.

6. The method of claim 4, further comprising:
selecting the circuit of the die under test to be a phase lock-loop.

7. The method of claim 4, further comprising:
selecting the node of the circuit of the die under test to be an internal bias point of the circuit.

8. The method of claim 1, further comprising:
programming a classification indicating a performance group into a memory within the die under test while in wafer form.

9. The method of claim 1, further comprising:
classifying the die under test as defective responsive to determining that the static voltage profile is outside of an established range for the static voltage profile.

10. A system, comprising:
a memory storing program code; and
a processor coupled to the memory, wherein responsive to executing the program code, the processor is configured to perform executable operations comprising:
storing a test static voltage profile for each of a plurality of dies tested in wafer form, wherein each test static voltage profile specifies a static voltage measured at a node of a circuit within the die;
storing a dynamic performance profile for each of the plurality of dies determined after packaging of the die, wherein each test static voltage profile is associated with the dynamic performance profile for the same die of the plurality of dies;
determining a static voltage profile of a die under test in wafer form by measuring a static voltage of a node of a circuit of the die under test;
matching the static voltage profile of the die under test in wafer form with a test static voltage profile of the plurality of test static voltage profiles;
assigning the dynamic performance profile associated with the matched test static voltage profile to the die under test; and
classifying the die under test into one of a plurality of different performance groups according to the assigned dynamic performance profile.

11. The system of claim 10, wherein the processor is further configured to perform an executable operation comprising:
programming a classification indicating a performance group into a memory within the die under test while in wafer form.

12. The system of claim 10, wherein the processor is further configured to perform an executable operation comprising:
classifying the die under test as defective responsive to determining that the static voltage profile is outside of an established range for the static voltage profile.

13. An apparatus, comprising:
a die,
wherein the die is in wafer form and comprises:
an input port configured to receive configuration data for the die;
a circuit placed in a known operating state responsive to loading the configuration data;
an analog-to-digital (A/D) converter coupled to a node of the circuit responsive to loading the configuration data, wherein the A/D converter is configured to sample a static voltage of the node;
an output port configured to output the sampled static voltage; and
a non-volatile memory coupled to the input port;
wherein the non-volatile memory stores a classification of the die written to the non-volatile memory during wafer testing, wherein the classification indicates a performance group of dies to which the die is assigned.

14. The apparatus of claim 13, wherein the die further comprises:
an analog multiplexer comprising an output coupled to the A/D converter; and
a buffer comprising an input configured to receive a signal from the node of the circuit and an output coupled to an input of the analog multiplexer,
wherein the analog multiplexer is configured to selectively pass the signal from the node of the circuit.

* * * * *